(12) United States Patent
Takano et al.

(10) Patent No.: US 6,682,621 B2
(45) Date of Patent: Jan. 27, 2004

(54) METHOD OF FORMING HIGH TEMPERATURE SUPERCONDUCTING JOSEPHSON JUNCTION

(75) Inventors: Yoshihiko Takano, Ibaraki (JP); Takeshi Hatano, Ibaraki (JP); Akira Ishii, Ibaraki (JP); Syunichi Arisawa, Ibaraki (JP); Kazumasa Togano, Ibaraki (JP)

(73) Assignee: National Institute for Materials Science, Ibaraki (JP)

( * ) Notice: Subject to any disclaimer, the term of this patent is extended or adjusted under 35 U.S.C. 154(b) by 26 days.

(21) Appl. No.: 09/932,941

(22) Filed: Aug. 21, 2001

(65) Prior Publication Data

US 2002/0025586 A1 Feb. 28, 2002

(30) Foreign Application Priority Data

Aug. 21, 2000 (JP) .......................... 2000-250269

(51) Int. Cl.[7] .......................... B32B 31/26; H01L 39/00
(52) U.S. Cl. .................. 156/89.12; 156/89.11; 257/33; 505/234; 505/329
(58) Field of Search .................. 156/89.11, 89.12; 438/2; 505/100, 234, 329; 257/31, 33, 36

(56) References Cited

U.S. PATENT DOCUMENTS

| 3,706,064 | A | * | 12/1972 | Dynes et al. |
| 4,157,555 | A | * | 6/1979 | Gray |
| 4,539,741 | A | * | 9/1985 | Ohta |
| 4,904,882 | A | * | 2/1990 | Szu |
| 5,624,885 | A | * | 4/1997 | Tanaka et al. |
| 5,883,051 | A | * | 3/1999 | Ishimaru et al. |

FOREIGN PATENT DOCUMENTS

| JP | 57-104283 | * | 6/1982 |
| JP | 61-181178 | * | 8/1986 |
| JP | 4-338684 | * | 11/1992 |
| JP | 5-190927 | * | 7/1993 |
| JP | 8-236827 | * | 9/1996 |

OTHER PUBLICATIONS

"In Situ Fabrication of Josephson Juncions Using a Stencil Process," IBM Technical Disclosure Bulletin, Mar. 1976, vol. 18, issue 10, pp. 3487–3488.*

* cited by examiner

Primary Examiner—Curtis Mayes
(74) Attorney, Agent, or Firm—Wenderoth, Lind & Ponack, L.L.P.

(57) ABSTRACT

A method of forming a novel high temperature superconducting Josephson junction which is capable of achieving a formation of a Josephson junction having high characteristic conveniently and quickly without necessitating costly micromachining facilities. Two high temperature superconducting whisker crystals are crossed with each other on a substrate and subjected to thermal treatment to form a Josephson junction between the two high temperature superconducting whisker crystals.

20 Claims, 3 Drawing Sheets

METHOD OF FORMING HIGH TEMPERATURE SUPERCONDUCTING JOSEPHSON JUNCTION

BACKGROUND OF THE INVENTION

The present invention relates to methods of forming high temperature superconducting Josephson junctions, more particularly, to a method of forming a high temperature superconducting Josephson junction which achieves a formation of a Josephson junction having high characteristics conveniently and quickly without necessitating costly micromachining facilities.

A high temperature superconducting Josephson device has gained a high attention and has been required to be commercialized as a new electronic device which realizes, for example, an ultrahigh frequency generating device capable of generating frequencies in a rang of terahertz or more, an ultrahigh frequency detecting device capable of detecting frequencies in a range of terahertz or more, a SQUID (superconducting quantum interference device) magnetometric sensor and, further, a digital device carrying a mass information processing system.

On the other hand, when the Josephson junction is formed using a single crystal or a thin film, the micromachining facilities which are used for producing a semiconductor device such as a convergence ion beam etching device and a photolithography device has ordinarily been employed. There, however, is a problem in using the micromachining facilities for producing such devices that, for example, not only a tremendously high cost, but also a complexity of production process and an extended period of production time are necessary. Further, it is difficult to conduct a study associated with the Josephson junction at a research institute without having the micromachining facilities whereupon, since the micromachining facilities are extremely highly priced, it is a present situation that a number of researchers who are related with the Josephson junction is limited.

Further, it is considered essential to achieve downsising the Josephson device from a viewpoint of, for example, prevention of malfunction to be caused by heat generation, reduction of power consumption, enhancement of integration and enhancement of characteristics.

SUMMARY OF THE INVENTION

The present invention has been accomplished under these circumstances and has an object to provide a method of forming a novel high temperature superconducting Josephson junction which achieves a formation of a Josephson junction having high characteristics conveniently and quickly without necessitating a costly micromachining facilities.

In order to attain the above-described object, the present invention provides, as a first aspect, a method of forming a high temperature superconducting Josephson junction comprising the steps of:

crossing high temperature superconducting whisker crystals with each other;

subjecting the thus crossed high temperature superconducting whisker crystals to thermal treatment, and forming a Josephson junction in a combined portion of the high temperature superconducting whisker crystals or in a neighborhood of the combined portion.

As a second aspect, the present invention provides a method of forming a high temperature superconducting Josephson junction comprising the steps of:

crossing linear high temperature superconducting thin films mask-processed into an elongate linear shape with each other on a substrate, subjecting the thus crossed linear high temperature superconducting thin films mask-processed into an elongate linear shape to thermal treatment; and forming a Josephson junction between the linear high temperature superconducting thin films.

As a third aspect, the present invention provides a method of forming a high temperature superconducting Josephson junction comprising the steps of:

crossing a linear high temperature superconducting thin film mask-processed into an elongate linear shape and a high temperature superconducting whisker crystal;

subjecting the thus crossed linear high temperature superconducting thin film mask-processed into an elongate linear shape and high temperature superconducting whisker crystal to thermal treatment; and forming a Josephson junction between the linear high temperature superconducting thin film and the high temperature superconducting whisker crystal.

As a fourth aspect, the present invention provides the method of forming the high temperature superconducting Josephson junction of the above-described first aspect in which one or both of the high temperature superconducting whisker crystals are substituted by a linear high temperature superconducting monocrystal processed into an elongate linear shape.

As a fifth aspect, the present invention provides the method of forming the high temperature superconducting Josephson junction of the above-described third aspect in which the high temperature superconducting whisker crystal is substituted by a linear high temperature superconducting monocrystal processed into an elongate linear shape.

As a sixth aspect, the present invention provides the method of forming the high temperature superconducting Josephson junction of any one of the foregoing aspects in which the high temperature superconducting whisker crystal, the linear high temperature superconducting thin film or the linear high temperature superconducting monocrystal which is to form a Josephson junction is a compound containing at least one phase of Bismuth 2212 phase, Bismuth 2201 phase and Bismuth 2223 phase.

As a seventh aspect, the present invention provides the method of forming the high temperature superconducting Josephson junction of any one of the foregoing aspects in which the high temperature superconducting whisker crystal, the linear high temperature superconducting thin film or the linear high temperature superconducting monocrystal which is to form a Josephson junction turns mutual the c-face up, and forming a Josephson junction.

As an eighth aspect, the present invention provides the method of forming the high temperature superconducting Josephson junction of any one of the foregoing aspects in which the high temperature superconducting whisker crystal, the linear high temperature superconducting thin film or the linear high temperature superconducting monocrystal which is to form a Josephson junction are adjusted at 45 to 90 degrees in the cross angle, and forming a Josephson junction.

Further, as a ninth aspect, the present invention provides the method of forming the high temperature superconducting Josephson junction of any one of the foregoing aspects in which the Josephson junction to be formed is an intrinsic Josephson junction.

Furthermore, as a tenth aspect, the present invention also provides a high temperature superconducting Josephson device provided with a Josephson junction to be formed by the method of forming the high temperature superconducting Josephson junction of any one of the foregoing aspects in which the high temperature superconducting Josephson device using other portions than a junction portion of a high temperature superconducting whisker crystal, a linear high temperature superconducting thin film or a linear high temperature superconducting monocrystal imparted with the Josephson junction as a wire material for a wire connection.

DETAILED DESCRIPTION OF THE INVENTION

Figure 1:
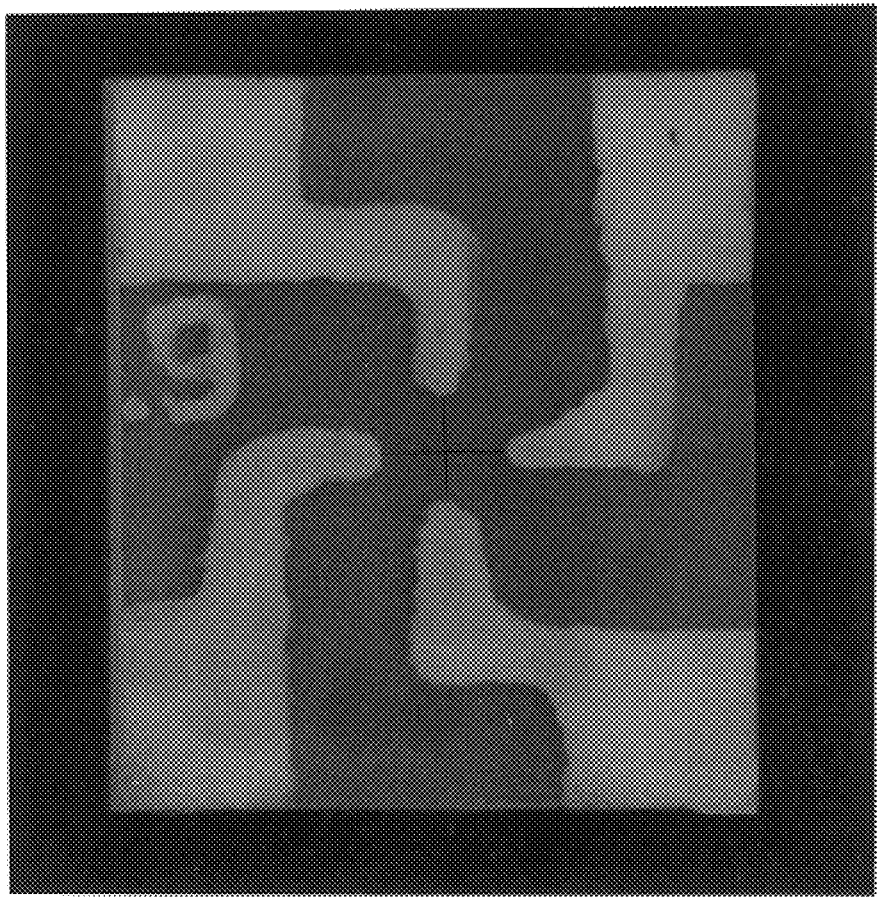
FIG. 1 is a photograph showing a Josephson junction formed in an embodiment according to the present inventions.

The present invention has characteristics as described above; embodiments thereof will be described below.

In a method of forming a high temperature superconducting Josephson junction according to the present invention, a Josephson junction having an extremely minute junction area is achieved by making use of a charactristic that a high temperature superconducting whisker crystal is in a needle like elongate shape. Specifically, for example, two high temperature superconducting whisker crystals are placed on a substrate such that they are crossed with each other and, then, subjected to thermal treatment to form a Josephson junction in a junction portion or in a neighborhood thereof. Since the junction area is extremely minute, it is not necessary to perform a special micromachining. About the temperature of thermal treatment, making a maximum into the melting point of a sample to use and making a minimum into about 500 degrees C. for example is illustrated as a general standard. More preferably, it in desirable to consider as 700 degrees C. or more. About thermal treatment atmosphere, it in desirable that oxygen is contained at least.

In the method of forming the high temperature superconducting Josephson junction according to the present invention, a linear high temperature superconducting thin film mask-processed into an elongate linear shape maybe used instead of using the high temperature superconducting whisker crystal. On this occasion, for example, two linear high temperature superconducting thin films are placed on the substrate such that they are crossed with each other and then subjected to thermal treatment thereby forming a Josephson junction between the two linear high temperature superconducting thin layers. Further, it is permissible that the high temperature superconducting whisker crystal and the linear high temperature superconducting thin film are placed each by one on the substrate such that they are crossed with each other and, then, subjected to thermal treatment to form the Josephson junction therebetween.

Furthermore, in the present invention, the above-described whisker may be substituted by the linear high temperature superconducting monocrystal processed into an elongate linear shape. Although it is known for the high temperature superconductor that a whisker will grow up to be only a bismuth system, a Josephson junction can be formed from a bismuth system high temperature superconductor or the other high temperature superconductor by cutting down a single crystal long and slender and using it.

In the method of forming the high temperature superconducting Josephson junction, the high temperature superconducting whisker crystal, the linear high temperature superconducting thin film or the linear high temperature superconducting monocrystal which is to form a Josephson junction may be various kinds of high temperature superconductors, preferably, is a compound which mainly contains either Bismuth 2212 phase, Bismuth 2201 phase and Bismuth 2223 phase. Moreover, it may be a compound containing at least two or more sorts of mixed phases of Bismuth 2212 phase Bismuth 2201 phase and Bismuth 2223 phase.

Examples of Josephson junctions to be formed by the method of forming the high temperature superconducting Josephson junction according to the present invention include an intrinsic Josephson junction. Ordinarily, it is extremely difficult to produce the intrinsic Josephson junction having a small number of junction layers; however, the method of forming the high temperature superconducting Josephson junction according to the present invention is capable of forming the intrinsic Josephson junction constituted with one layer or a small number of junction layers.

In the method of forming the high temperature superconducting Josephson junction, the high temperature superconducting whisker crystal, the linear high temperature superconducting thin film or the linear high temperature superconducting monocrystal which is to form a Josephson junction can form a Josephson junction in arbitrary crystal faces mutually. For example, a Josephson junction of the a-face and the a-face, a Josephson junction in the b-face and the b-face, etc. are possible. And the optimum combination of a crystal face in the case where turns mutual the c-face up, and forming a Josephson junction. That is, it is joining the c-face. Moreover, the Josephson characteristic is artificially controllable by changing a cross angle of these high temperature superconductors. Specifically, Josephson current serves as the maximum, when for example, a cross angle is about 90 degrees, and it serves as the minimum at about 45 degrees. Therefore, in case Josephson junction is applied as an element, it is enabled to control artificially the timing (current value) of switching for every element.

Further, in the high temperature superconducting Josephson device which has been provided with the Josephson junction formed by the method of forming the high temperature superconducting Josephson junction according to the present invention, other portions than a junction portion of the high temperature superconducting whisker crystal, the linear high temperature superconducting thin film or the linear high temperature superconducting monocrystal which has been imparted with a Josephson junction are used as a wire material for a wire connection terminal whereby a wire connection in a superconducting state can be realized to materialize prevention of a malfunction caused by heat generation in the Josephson device and reduction of power consumption.

The present invention has the characteristics as described above and will further be described in detail by embodiments below.

EXAMPLE

A Josephson junction was formed by a method of forming a high temperature superconducting Josephson junction according to the present invention. As a sample, two Bismuth 2212 high temperature superconducting whiskers were placed on an MgO substrate such that they are crossed with each other to be in a cross shape. Subsequently, such two high temperature superconducting whiskers were placed in a furnace together with the substrate and subjected to thermal treatment under a condition that an oxygen atmosphere was controlled. As sintering conditions, a temperature was 850° C., an oxygen partial pressure was 70% and a period of time of sintering was 30 minutes.

Figure 2:
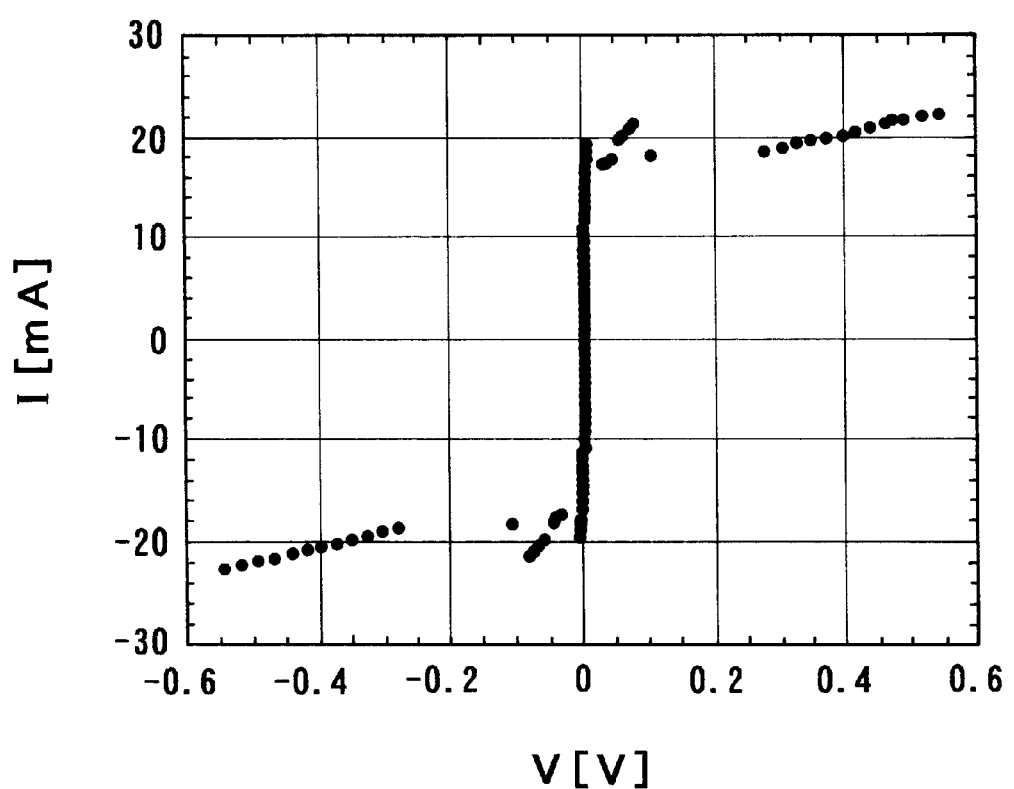
FIG. 2 is a graph showing a result of measurement of current-voltage characteristics of a Josephson junction formed in an embodiment according to the present invention.
Figure 3:
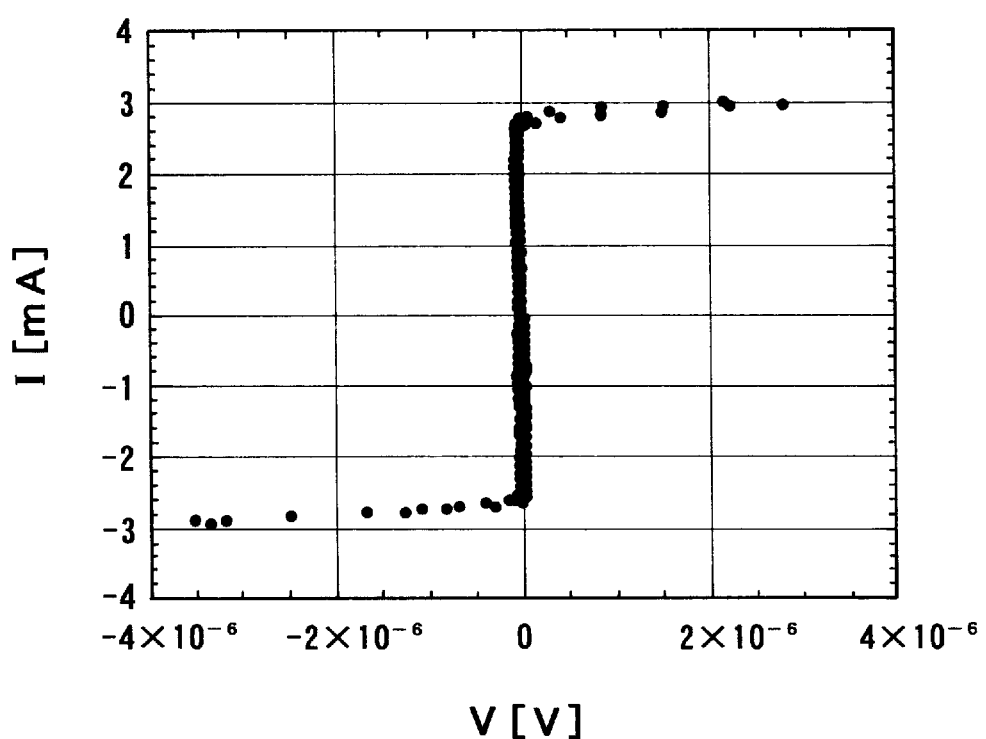
FIG. 3 is another graph showing a result of measurements of a current-voltage characteristics of a Josephson junction formed in an embodiment according to the present invention.

FIG. 1 shows a photograph of a sample after subjected to thermal treatment. An end portion of the thus thermally treated sample was then provided with a current-voltage terminal. Current-voltage characteristics of a Josephson junction portion of the resultant sample were measured. FIG. 2 shows a result of the thus obtained measurements Further, a Bismuth 2212 high temperature superconducting whisker and a Bismuth 2212 linear high temperature superconducting thin film were placed on an MgO substrate such that they were crossed with each other to be in a cross shape and subjected to thermal treatment under sintering conditions described above to obtain a sample. FIG. 3 shows a result of measurements of the current-voltage characteristics of the Josephson junction of the thus obtained sample. It is found from FIGS. 2 and 3 that advantageous superconducting characteristics have been obtained in each of the above-obtained samples.

As described in detail above, according to the present invention, provided is a method of forming a novel high temperature superconducting Josephson junction to achieve a formation of a Josephson junction having high characteristics conveniently and quickly without necessitating costly micromachining facilities. The present invention contributes to activation of research of a superconducting device and, further, with regard to the superconducting device, has a variety of technical effects such as reduction of production cost, simplification of production facilities and reduction of production time period. The Josephson device produced by the present invention is imparted with excellent functionality and characteristics; hence, capability of applications thereof to various fields such as communication technology, sensor technology and information processing technology can be considered and are strongly required to be commercialized.

What is claimed is:

1. A method of forming a high temperature superconducting Josephson junction comprising the steps of:
    crossing high temperature superconducting whisker crystals with each other;
    subjecting the thus crossed high temperature superconducting whisker crystals to thermal treatment; and
    forming a Josephson junction in a combined portion of the high temperature superconducting whisker crystals or in a neighborhood of said combined portion.

2. The method of forming the high temperature superconducting Josephson junction as set forth in claim 1, wherein the high temperature superconducting whisker crystals, which are to form a Josephson junction are a compound containing at least one phase of Bismuth 2212 phase, Bismuth 2201 phase and Bismuth 2223 phase.

3. The method of forming the high temperature superconducting Josephson junction as set forth in claim 1, wherein the high temperature superconducting whisker crystals, which are to form a Josephson junction are adjusted at 45 to 90 degrees in the cross angle, and forming a Josephson junction.

4. The method of forming the high temperature superconducting Josephson junction as set forth in claim 1, wherein the Josephson junction to be formed is an intrinsic Josephson junction.

5. A method of forming a high temperature superconducting Josephson junction comprising the steps of:
    crossing linear high temperature superconducting thin films mask-processed into an elongate linear shape with each other;
    subjecting the thus crossed linear high temperature superconducting thin films mask-processed into an elongate linear shape to thermal treatment; and
    forming a Josephson junction between the linear high temperature superconducting thin films.

6. The method of forming the high temperature superconducting Josephson junction as set forth in claim 5, wherein the linear high temperature superconducting thin films which are to form a Josephson junction are a compound containing at least one phase of Bismuth 2212 phase, Bismuth 2201 phase and Bismuth 2223 phase.

7. The method of forming the high temperature superconducting Josephson junction as set forth in claim 5, wherein the linear high temperature superconducting thin films which are to form a Josephson junction are adjusted at 45 to 90 degrees in the cross angle, and forming a Josephson junction.

8. The method of forming the high temperature superconducting Josephson junction as set forth in claim 5, wherein the Josephson junction to be formed is an intrinsic Josephson junction.

9. A method of forming a high temperature superconducting Josephson junction comprising the steps of:
    crossing a linear high temperature superconducting thin film mask-processed into an elongate linear shape and a high temperature superconducting whisker crystal;
    subjecting the thus crossed linear high temperature superconducting thin film mask-processed into an elongate linear shape and high temperature superconducting whisker crystal to thermal treatment; and
    forming a Josephson junction between the linear high temperature superconducting thin film and the high temperature superconducting whisker crystal.

10. The method of forming the high temperature superconducting Josephson junction as set forth in claim 9, wherein the high temperature superconducting whisker crystal and the linear high temperature superconducting thin film which are to form a Josephson junction are a compound containing at least one phase of Bismuth 2212 phase, Bismuth 2201 phase and Bismuth 2223 phase.

11. The method of forming the high temperature superconducting Josephson junction as set forth in claim 9, wherein the high temperature superconducting whisker crystal and the linear high temperature superconducting thin film which are to form a Josephson junction are adjusted at 45 to 90 degrees in the cross angle, and forming a Josephson junction.

12. The method of forming the high temperature superconducting Josephson junction as set forth in claim 9, wherein the Josephson junction to be formed is an intrinsic Josephson junction.

13. A method of forming a high temperature superconducting Josephson junction comprising:
    crossing a linear high temperature superconducting monocrystal processed into an elongate linear shape with another linear high temperature superconducting monocrystal processed into an elongate linear shape or a high temperature superconducting whisker crystal;
    subjecting the thus crossed crystals to thermal treatment; and
    forming a Josephson junction in a combined portion of the crystals or in a neighborhood of said combined portion.

14. The method of forming the high temperature superconducting Josephson junction as set forth in claim 13, wherein the high temperature superconducting whisker crystal and the linear high temperature superconducting monocrystal, or the linear high temperature superconducting monocrystals, which are to form a Josephson junction are a compound containing at least one phase of Bismuth 2212 phase, Bismuth 2201 phase and Bismuth 2223 phase.

15. The method of forming the high temperature superconducting Josephson junction as set forth in claim 13, wherein the high temperature superconducting whisker crystal and the linear high temperature superconducting monocrystal, or the linear high temperature superconducting monocrystals which are to form a Josephson junction are adjusted at 45 to 90 degrees in the cross angle, and forming a Josephson junction.

16. The method of forming the high temperature superconducting Josephson junction as set forth in claim 13, wherein the Josephson junction to be formed is an intrinsic Josephson junction.

17. A method of forming a high temperature superconducting Josephson junction comprising:

crossing a linear high temperature superconducting thin film mask-processed into an elongate linear shape and a linear high temperature superconducting monocrystal processed into an elongate linear shape;

subjecting the thus crossed thin film and monocrystal to thermal treatment; and forming a Josephson junction between the thin film and the whisker crystal.

18. The method of forming the high temperature superconducting Josephson junction as set forth in claim 17, wherein the linear high temperature superconducting thin film and the linear high temperature superconducting monocrystal which are to form a Josephson junction are a compound containing at least one phase of Bismuth 2212 phase, Bismuth 2201 phase and Bismuth 2223 phase.

19. The method of forming the high temperature superconducting Josephson junction as set forth in claim 17, wherein the linear high temperature superconducting thin film and the linear high temperature superconducting monocrystal which are to form a Josephson junction are adjusted at 45 to 90 degrees in the cross angle, and forming a Josephson junction.

20. The method of forming the high temperature superconducting Josephson junction as set forth in claim 17, wherein the Josephson junction to be formed is an intrinsic Josephson junction.

* * * * *